United States Patent
Bernitz et al.

(10) Patent No.: US 7,537,963 B2
(45) Date of Patent: May 26, 2009

(54) DEVICE AND METHOD FOR MANUFACTURING THE SAME

(76) Inventors: Georg Bernitz, Vordere Marktstrasse 9, D-90441 Nürnberg (DE); Heinrich Zitzmann, Blütenweg 14, D-91207 Lauf an der Pegnitz (DE)

( * ) Notice: Subject to any disclaimer, the term of this patent is extended or adjusted under 35 U.S.C. 154(b) by 37 days.

(21) Appl. No.: 11/433,613

(22) Filed: May 12, 2006

(65) Prior Publication Data

US 2006/0214267 A1    Sep. 28, 2006

Related U.S. Application Data

(63) Continuation of application No. PCT/EP2004/013384, filed on Nov. 25, 2004.

(30) Foreign Application Priority Data

Nov. 28, 2003  (DE)  ................................ 103 56 367

(51) Int. Cl.
 *H01L 21/00* (2006.01)
(52) U.S. Cl. .................... 438/110; 438/107; 438/108
(58) Field of Classification Search .............. 438/107, 438/108, 110
 See application file for complete search history.

(56) References Cited

U.S. PATENT DOCUMENTS

| | | | |
|---|---|---|---|
| 4,481,404 A * | 11/1984 | Thomas et al. ............... | 219/398 |
| 4,621,190 A | 11/1986 | Saito et al. | |
| 5,425,647 A | 6/1995 | Mencik et al. | |
| 5,534,843 A | 7/1996 | Tsunoda et al. | |
| 5,929,746 A | 7/1999 | Edwards, Jr. et al. | |
| 6,082,609 A | 7/2000 | Wienand et al. | |
| 6,248,978 B1 | 6/2001 | Okuda | |
| 6,683,370 B1 * | 1/2004 | McDonald et al. ........... | 257/676 |
| 6,780,677 B2 * | 8/2004 | Imasu et al. ................. | 438/118 |
| 7,176,057 B2 * | 2/2007 | Hable ........................ | 438/107 |
| 2002/0050921 A1 | 5/2002 | Groen et al. | |
| 2002/0076149 A1 * | 6/2002 | Deacon ....................... | 385/27 |
| 2002/0118093 A1 | 8/2002 | Bernitz et al. | |
| 2004/0021087 A1 * | 2/2004 | Tokhtuev et al. ............ | 250/372 |
| 2004/0197953 A1 * | 10/2004 | Funk .......................... | 438/108 |
| 2005/0195488 A1 * | 9/2005 | McCabe et al. ............. | 359/603 |
| 2007/0211183 A1 * | 9/2007 | Erchak et al. ................ | 349/1 |
| 2007/0211184 A1 * | 9/2007 | Erchak et al. ................ | 349/1 |
| 2007/0279752 A1 * | 12/2007 | McCabe et al. ............. | 359/603 |

FOREIGN PATENT DOCUMENTS

| | | |
|---|---|---|
| DE | 19621001 A1 | 11/1997 |
| DE | 19840248 A1 | 3/2000 |
| DE | 19936924 C1 | 6/2001 |
| EP | 0060427 A2 | 9/1982 |
| WO | 92/13319 | 8/1992 |
| WO | 01/84562 A1 | 11/2001 |

* cited by examiner

*Primary Examiner*—Fernando L Toledo
(74) *Attorney, Agent, or Firm*—Mayback & Hoffman, P.A.; Gregory L. Mayback; Scott D. Smiley

(57) ABSTRACT

In a method for manufacturing a device, at first a plurality of components each having at least a first terminal region are provided. Furthermore, a support with a first surface, in which a plurality of recesses are formed, is provided. The components provided are inserted into the recesses such that the first terminal region of each component faces the first surface of the support. Conductive material is applied on the first surface of the support such that the conductive material is in contact with the first terminal region of each component. Finally, the support is diced to obtain the individual devices.

10 Claims, 3 Drawing Sheets

DEVICE AND METHOD FOR MANUFACTURING THE SAME

CROSS-REFERENCE TO RELATED APPLICATION

This application is a continuation of co-pending International application No. PCT/EP2004/013384, filed Nov. 25, 2004, which designated the United States and was not published in English and is incorporated herein by reference in its entirety.

BACKGROUND OF THE INVENTION

1. Field of the Invention

The present invention relates to a device and to a method for manufacturing the same, and here in particular to a device having a component very small in dimension with terminal regions, which is good to handle and to contact due to the embedding into the device.

2. Description of the Related Art

In the prior art, there is the tendency to shrink or to miniaturize components and electric circuits further and further, so that for example on a single wafer or substrate a multiplicity of components are manufactured in high density, which are subsequently diced for further use.

The advantage of this miniaturization consists in that on the one hand the room occupied by the components may be reduced in other components, and, which is also very substantial, a multiplicity of such components can be manufactured in a single substrate, so that the resources required for the manufacture are taken advantage of more and more optimally. From one substrate, now a multiplicity of components is obtained, so that by employment of the same amount of material increased yield may be obtained, so that the overall costs for each individual component are reduced with regard to the substrate material used corresponding to the room occupied by the device.

Depending on the field of employment, and in particular on the number of components used, these are arranged for example in straps after their dicing and fed to an automatic component-insertion machine, which then places and contacts the components at corresponding locations of a printed circuit board or another circuit.

The size of the components usually does not pose a problem due to the automatic processing and the mounting technology chosen. The situation is different when the devices used are used in a number not enabling strapped arrangement of the components and also no automatic population.

As an example, here temperature sensors are to be considered, which are usually placed individually and further contacted with a lead wire. Due to the many varying locations of employment of such sensor devices, automated population does usually not make sense.

The above-described advantages regarding material yield and the like, which are obtained by the further miniaturization, lead, however, in connection with the handling of individual temperature sensors, to all new problems as a countermove, in particular regarding the durability of such components and the contacting capacity of such components.

More specifically, it is obvious that components having such small dimensions are only difficult to handle since those are only difficult to grip and to place. Accordingly, there is not insignificant danger that components get lost, slip, or may be placed improperly in another way. A further problem occurs when the components are not soldered, but are for example to be contacted with a lead wire. For such a contact type, it is required to provide sufficient contact area in order to so be able to solder the lead wire to a terminal region of the component securely. It is obvious that with device dimensions becoming ever smaller also the areas available for the attachment of a lead wire become ever smaller, so that here, to be consistent, a reduction in the adhesion forces results, which in the end leads to reduced connection reliability.

SUMMARY OF THE INVENTION

Starting from this prior art, it is an object of the present invention to provide an enhanced method for manufacturing a device and an enhanced device, which enables to handle and to contact a component securely and reliably despite its small dimension.

In accordance with a first aspect, the present invention provides a method for manufacturing devices, with the steps of: providing a plurality of components each having at least a first terminal region; providing a support having a first surface, in which a plurality of recesses are formed; inserting the components provided into the recesses such that the first terminal region of each component faces the first surface of the support; applying a conductive material on the first surface of the support such that the conductive material is in contact with the first terminal region of each component; and dicing the support to obtain the individual devices.

In accordance with a second aspect, the present invention provides a device manufactured according to the method for manufacturing devices, with the steps of: providing a plurality of components each having at least a first terminal region; providing a support having a first surface, in which a plurality of recesses are formed; inserting the components provided into the recesses such that the first terminal region of each component faces the first surface of the support; applying a conductive material on the first surface of the support such that the conductive material is in contact with the first terminal region of each component; and dicing the support to obtain the individual devices, the device having: a support having a first surface, in which a recess is arranged; a component having a first terminal region, which is arranged in the recess, such that the first terminal region faces the first surface; and a conductive layer on the first surface of the support, which is in contact with the first terminal region of the component.

The present invention provides a method for manufacturing a device, comprising:.
  providing at least one component having at least a first terminal region;
  providing a support having a first surface in which at least one recess is formed;
  inserting the component provided into the recess such that the first terminal region of the component faces the first surface of the support; and
  applying conductive material on the first surface of the support such that the conductive material is in contact with the first terminal region of the component.

According to a preferred embodiment, the component includes a first terminal region and a second terminal region, and the recess in the support extends all the way through the same, i.e. from the first surface of the support to a second surface of the support opposing the first surface. In this embodiment, the component is then inserted into the recess, so that the first terminal region faces the first surface and the second terminal region faces the second surface. In addition, conductive material is now also applied on the second surface of the support, so that this is in contact with the second terminal region of the component.

According to a further preferred embodiment of the present invention, the support includes a plurality of recesses arranged spaced from each other and into which a component each is inserted, wherein after applying the one conductive layer or the two conductive layers on the opposing surfaces a plurality of devices are generated from the support so processed, such that a dimension of each device is greater than the inserted component and a terminal region of the device is greater than the terminal region of the component. Preferably, generating the plurality of devices includes splitting the support, for example by sawing the support, or punching out the devices from the support.

According to a further preferred embodiment, the conductive material contacting the terminal regions of the component are burned in after applying.

The recess in the support, which for example includes a ceramic material, may take place by punching or lasing. The conductive material preferably includes platinum, gold, and/or nickel. Furthermore, the component provided preferably includes a temperature sensor. Preferably, for the support a material is used the expansion coefficient of which almost equals or equals the expansion coefficient of the material for the component.

The present invention further provides a device, having a support with a first surface in which a recess is arranged;
a component with a first terminal region, which is arranged in the recess such that the first terminal region faces the first surface; and
a conductive layer on the first surface of the support, which is in contact with the first terminal region of the component.

According to a further embodiment, the component includes a second terminal region, and the recess extends through the support from its first surface to its second surface opposing the first surface. A further conductive layer is applied on the second surface of the support and contacts the second terminal region of the component.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
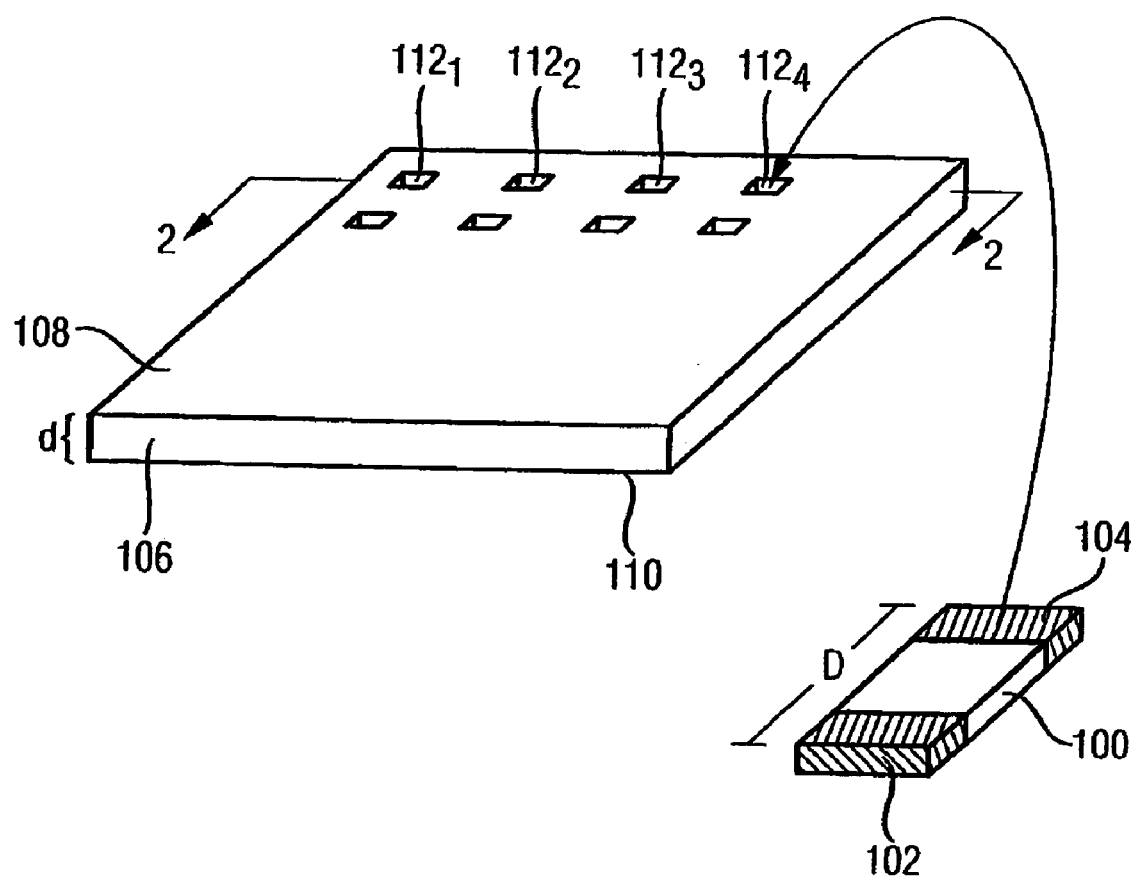
FIG. 1 to FIG. 5 are illustrations explaining a preferred embodiment of the inventive method for manufacturing the devices.

Regarding the following description of the preferred embodiments, it is pointed out that in the appended drawings like or similar elements are provided with like reference numerals.

On the basis of FIG. 1 to FIG. 5, a preferred embodiment of the inventive manufacturing method is now explained in greater detail on the basis of temperature sensors.

In FIG. 1, a SMD temperature sensor 100 is shown, which has a first terminal region 102 and a second terminal region 104. The SMD temperature sensor shown has a longitudinal dimension D, as this is shown in FIG. 1. Although the preferred embodiment is described on the basis of SMD temperature sensors, it is to be noted that the present invention is not limited hereto, but rather finds application with arbitrary components having at least one terminal region.

In a first step, a plurality of SMD temperature sensors 100 are provided, which were manufactured conventionally, for example. The SMD device 100 is, for example, a chip device manufactured conventionally.

Furthermore, a support 106, for example of ceramic material, is provided. The support 106 has a first surface 108 and a second surface 110 opposing the first surface 108. In the embodiment illustrated in FIG. 1, a plurality of recesses $112_1$ to $112_4$ are formed in the surface 108 of the support 106. In the embodiment shown, the recesses $112_1$ to $112_4$ extend through the entire thickness d of the support 106, i.e. from the first surface 108 to its second surface 110. As indicated by the arrow 114 in FIG. 1, in a further procedural step, a SMD temperature sensor 100 is inserted into each of the recesses $112_1$ to $112_4$. The thickness d of the support 106 substantially corresponds to the thickness D of the SMD temperature sensor 100. The SMD temperature sensors are inserted into the recesses so that the first terminal region 102 of a SMD temperature sensor 100 faces an opening of the recess in the first surface 108 of the support, and that the second terminal region 102 of a SMD temperature sensor 100 faces an opening of the recess in the second surface 110 of the support 106. In other words, the SMD temperature sensors are inserted into the horizontally resting support in a substantially vertical orientation. The recesses $112_1$ to $112_4$ are inserted into the ceramic support 106 by suitable measures, for example by punching or lasing.

Figure 2:
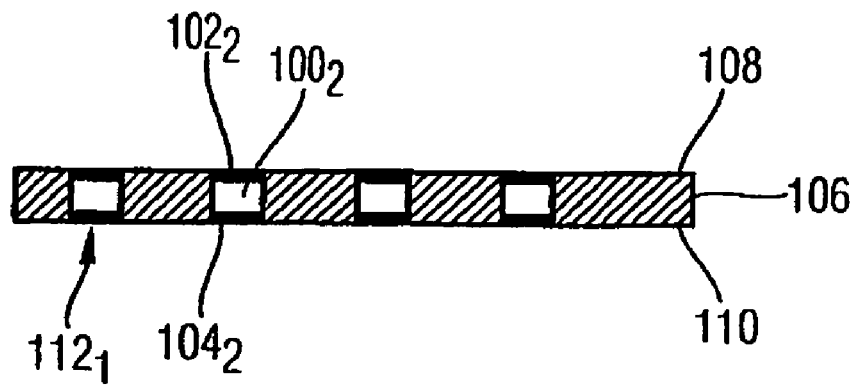

FIG. 2 shows a cross-sectional illustration of a ceramic support 106 with SMD temperature sensors 100 inserted into the recesses $112_1$ to $112_4$. For simplicity's sake and in order to preserve the clarity of the illustration in FIG. 2, there, only as an example, the SMD device arranged in the recess $112_2$ is designated with the corresponding reference numerals $100_2$, $112_2$, and $104_2$.

Figure 3:
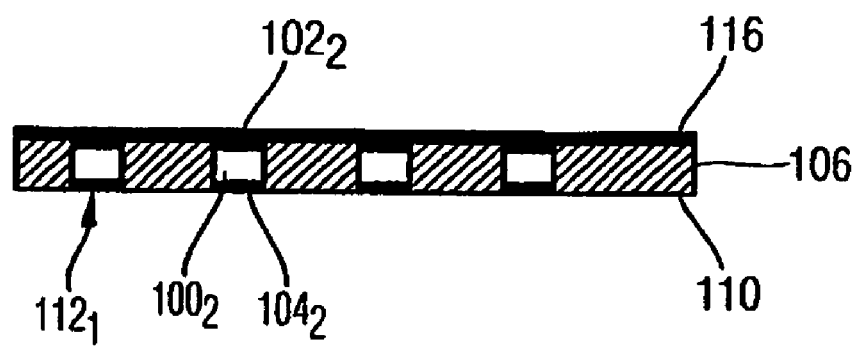

In a subsequent procedural step, a conductive layer 116, for example, of platinum, gold, and/or nickel is applied on the first surface 108 of the support 106, as this can be seen in FIG. 3. As can also be seen, the conductive layer 116 is applied such that it is in contact with the first terminal regions 102 of the temperature sensors 100 arranged in the recesses 112. Then, preferably burning-in the applied material 116 takes place.

Figure 4:
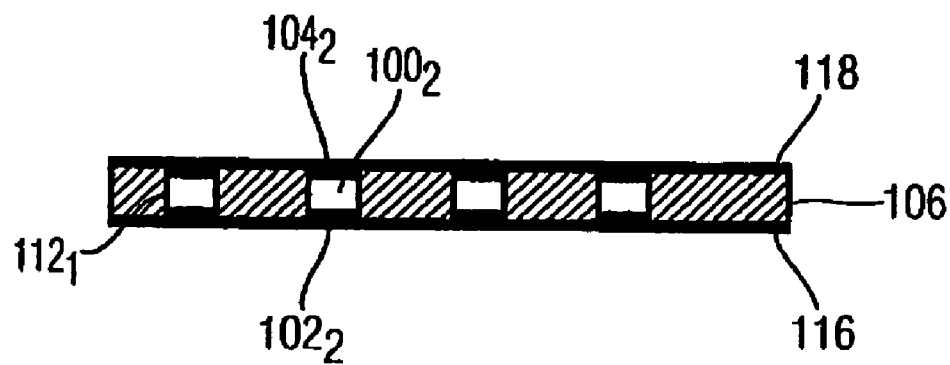
Figure 5:
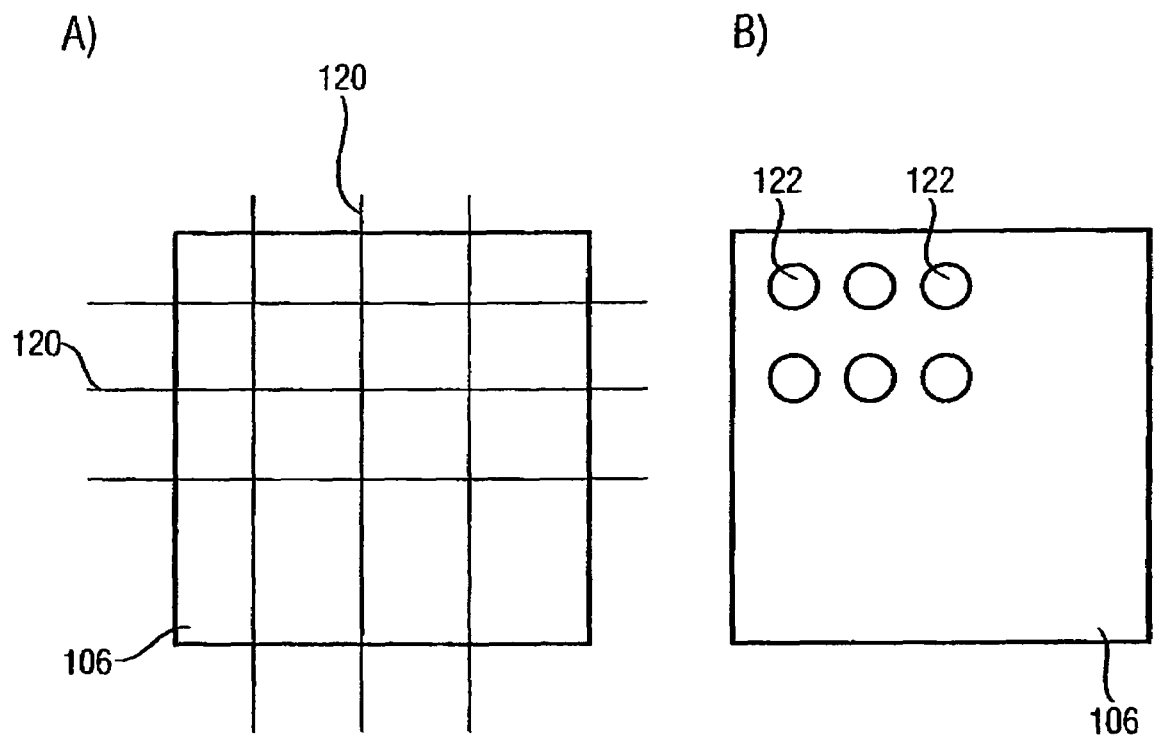

Subsequently, the arrangement shown in FIG. 3 is tuned, and a further conductive layer 118 is applied on the second surface now facing up, such that it contacts the second terminal regions 104 of the SMD temperature sensors 100 arranged in the recesses 112, as this is shown in FIG. 4. Then, again optionally, burning-in the applied layer 118 may take place.

In order to obtain the individual devices, the arrangement shown in FIG. 4 is subsequently split by either sawing the substrate 106 along predetermined saw lines 120, as they are shown in FIG. 5A, or by punching out, as it is shown in FIG. 5B, regions of the support 106 with the components arranged therein, as this is illustrated in FIG. 5B at 122. In addition, also other known methods for dicing the devices may be performed.

Figure 6:
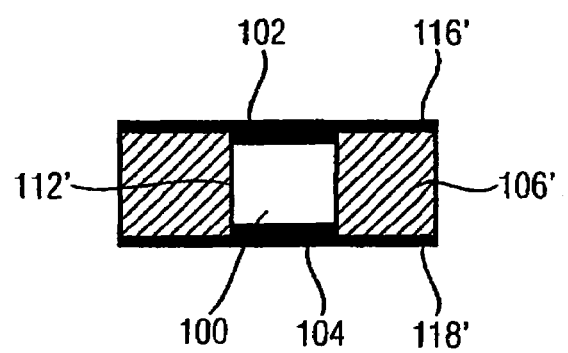
FIG. 6 is a cross-sectional illustration of the inventive device according to a preferred embodiment.

FIG. 6 shows a device resulting after the dicing according to the present invention, according to a preferred embodiment. As can be seen, the device includes a portion of the support 106' with a recess 112' in which the SMD temperature sensor 100 is arranged. On the opposing surfaces of the support portion 106', the conductive layer portions 116' and 118', respectively, are formed, which are in contact with the terminal regions 102 and 104 of the SMD temperature sensor 100, respectively.

As can be seen, the dimension of the resulting device is significantly greater than that of the original SMD temperature sensor 100, so that its handling capability is significantly enhanced. Furthermore, on the opposing surface of the support section 106', there are conductive terminal regions 116' and 118', which are also greater than the terminal regions 102 and 104 of the SMD temperature sensor, so that here an enlarged pad for secure and reliable contacting of the component. 100 is achieved.

An advantage of the present invention is that here a more reliable handling and contacting of the SMD temperature sensor is achieved without increasing the portion of material that would be required for the manufacture of the SMD temperature sensor. In the prior art, the approach to the increase of the handling capability and the reliability in contacting would have been achieved by manufacturing, in the wafer in which the SMD temperature sensors are manufactured, those with lower density. In this case, there is, around the actual temperature sensor area, additional substrate material, which would not be required for the actual functionality of the sensor element, but would be left for reasons of its handling capacity and contacting capacity. Thus, with such an approach, high-grade substrate material, which actually is exclusively required for the manufacture of the SMD devices, would be "wasted", so that the costs for such an element would be unnecessarily high.

According to the invention, these problems are avoided, because now in fact the expensive substrate material is only used for those elements for which it is actually required, namely the manufacture of the SMD temperature sensors. In order to provide improved handling capability, the present invention teaches a novel approach, namely the use of a support of a simple and inexpensive support material, such as ceramics, in which the holes are inserted, in which then the SMD temperature sensors are inserted, contacted and diced.

The holes are preferably inserted in a way that the SMD temperature sensors may be inserted in a simple manner and held there for example by friction, so that falling out of the inserted elements is avoided.

Alternatively, an auxiliary layer may be provided on the reverse side of the ceramic support, which is maintained until the processing of the front side, so that in this case the reverse openings of the recesses are temporarily closed, until the SMD temperature sensors are held in the recesses by the conductive layer after the contacting thereof.

Furthermore, the present invention is not limited to concurrently arrange a plurality or multiplicity of components in a support. The present invention may also be applied with individual components, which are inserted into a correspondingly dimensioned support element with a recess, wherein the procedural steps to be performed correspond to those described above on the basis of FIG. 1 to FIG. 4.

The support preferably includes a non-conductive material, such as glass, epoxy, polyimide, ceramics, unburned ceramic material (green sheet), etc. Alternatively, the support may comprise a conductive material, wherein then the surfaces of the support are coated with insulating material (e.g. aluminum support with anodized surfaces.

The recesses may have an arbitrary shape and be inserted by suitable mechanical treatment of the support, e.g. milling, punching, etc., or by chemical treatment of the support, e.g. etching.

The conductive layer is applied for example by sputtering, vapor-depositing, screen printing, etc., and includes e.g. platinum, gold, silver, nickel, etc. Alternatively, the conductive layer may be formed by conductive glue.

While this invention has been described in terms of several preferred embodiments, there are alterations, permutations, and equivalents which fall within the scope of this invention.

It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for manufacturing devices, comprising the steps of:
   providing a plurality of components, each component having:
      a body with:
         a first main surface;
         a second main surface opposing the first main surface;
         a first end face;
         a second end face opposing the first end face, the first and second end faces connecting the two opposing main surfaces to each other;
         a first side surface; and
         a second side surface opposing the first side surface, the first and second side surfaces connecting the two opposing main surfaces to each other; and
      a first terminal formed at the first end face at a first end of the body;
   providing a support having a first surface and a plurality of recesses formed in the support to extend from the first surface into the support;
   inserting each of the plurality of components into a respective one of the plurality of recesses, each component being positioned so that its respective first main surface is perpendicular to the first surface of the support such that the first terminal of each of the plurality of components faces the first surface of the support;
   applying a conductive material on the first surface of the support such that the conductive material is in contact with the first terminal of each of the plurality of components; and
   dicing the support to obtain the individual devices.

2. The method of claim 1, wherein
   each of the components further comprise a second terminal formed at the second end face at a second end of the body, the second end of the body opposing the first end of the body;
   the recesses in the support extend from the first surface to a second surface opposing the first surface; and
   the components are inserted in the recesses such that the first terminal faces the first surface and the second terminal faces the second surface;
   wherein the method further comprises the step of:
   applying a conductive material on the second surface of the support such that the conductive material is in contact with the second terminal of each component.

3. The method of claim 1, comprising the step of:
   burning-in the conductive material.

4. The method of claim 1, further comprising the step of:
   generating the plurality of devices from the support with the components arranged therein, such that a dimension of each device is greater than that of the inserted component, and a terminal region of the device is greater than the first and second terminals region of the component.

5. The method of claim 4, wherein dicing the support includes splitting the support or punching the support.

6. The method of claim 1, wherein the recess in the support is generated by mechanical or chemical treatment.

7. The method of claim 1, wherein the support includes non-conductive material selected from the group including glass, ceramics, unburned ceramic material, epoxy, or polyimide, or including conductive material with a non-conductive surface.

8. The method of claim 1, wherein the conductive material includes platinum, gold, silver, nickel or conductive glue.

9. The method of claim 1, wherein the component provided includes a temperature sensor.

10. A method for manufacturing devices, comprising the steps of:

providing a plurality of components, each component having:

a body with:
- a first main surface;
- a second main surface opposing the first main surface;
- a first end face;
- a second end face opposing the first end face, the first and second end faces connecting the two opposing main surfaces to each other;
- a first side surface; and
- a second side surface opposing the first side surface, the first and second side surfaces connecting the two opposing main surfaces to each other;

a first terminal formed at the first end face at a first end of the body;

a second terminal formed at the second end face at a second end of the body opposing the first end of the body;

providing a support having a first surface and a plurality of recesses formed in the support to extend from the first surface through the support to a second surface opposing the first surface;

inserting each of the plurality of components into a respective one of the recesses with their main surface being perpendicular to the first and second surfaces of the support such that the first terminal of each of the plurality of components faces the first surface of the support and the second terminal of each of the plurality of components faces the second surface;

applying a conductive material on the first surface of the support such that the conductive material is in contact with the first terminal of each of the plurality of components;

applying a conductive material on the second surface of the support such that the conductive material is in contact with the second terminal of each of the plurality of components and dicing the support to obtain the individual devices.

* * * * *